(12) United States Patent
Lin et al.

(10) Patent No.: US 9,836,636 B2
(45) Date of Patent: Dec. 5, 2017

(54) CAPACITIVE IMAGE SENSOR THAT OBTAINS A NOISE-REDUCED IMAGE OF A FINGER

(71) Applicant: SunASIC Technologies, Inc., New Taipei (TW)

(72) Inventors: Chi-Chou Lin, New Taipei (TW); Zheng-Ping He, Taipei (TW)

(73) Assignee: Sunasic Technologies Inc., New Taipei (TW)

(*) Notice: Subject to any disclaimer, the term of this patent is extended or adjusted under 35 U.S.C. 154(b) by 0 days.

(21) Appl. No.: 15/189,022

(22) Filed: Jun. 22, 2016

(65) Prior Publication Data

US 2016/0379034 A1 Dec. 29, 2016

Related U.S. Application Data

(60) Provisional application No. 62/184,365, filed on Jun. 25, 2015.

(51) Int. Cl.
*G06K 9/00* (2006.01)
*H01L 27/146* (2006.01)

(52) U.S. Cl.
CPC ...... *G06K 9/0002* (2013.01); *H01L 27/14609* (2013.01); *H01L 27/14612* (2013.01)

(58) Field of Classification Search
CPC .... G06K 9/605; G06K 9/0002; G06K 9/4652; G06K 9/6215; G06F 3/044; G06F 2203/04104; G06T 7/0004; G01J 3/46; G01N 21/251; H01L 27/14609; H01L 27/14612
See application file for complete search history.

(56) References Cited

U.S. PATENT DOCUMENTS

2012/0085822 A1\* 4/2012 Setlak ................. G06K 9/0002
235/439

\* cited by examiner

*Primary Examiner* — Kenny Cese
(74) *Attorney, Agent, or Firm* — Che-Yang Chen; Law Offices of Scott Warmuth

(57) ABSTRACT

A capacitive image sensor and a method for running the capacitive image sensor are disclosed. The capacitive image sensor includes a number of capacitive sensing elements, forming an array, each capacitive sensing element for transforming a distance between a portion of a surface of an approaching finger and a top surface thereof into an output voltage, wherein a value of the output voltage is changed by a driving signal exerted on the finger; an A/D converter, for converting the output voltage into a number and outputting the number; and a signal source, for providing the driving signal to the finger.

12 Claims, 13 Drawing Sheets

CAPACITIVE IMAGE SENSOR THAT OBTAINS A NOISE-REDUCED IMAGE OF A FINGER

FIELD OF THE INVENTION

The present invention relates to a pixel sensing element. More particularly, the present invention relates to a capacitive image sensor using the pixel sensing element, and a method for running the pixel sensing elements.

BACKGROUND OF THE INVENTION

There are many human physiological characteristics which can be used to provide personnel identification for security purposes, such as fingerprint, retina, iris, DNA, or even face features. For all the devices that are capable of distinguishing some physiological characteristic of one person from others', a fingerprint reader has the lowest cost and complexity, while the identification results are generally pretty good. In addition, the size of data required to store the minutiae of one fingerprint is small (ranging from 120 bytes to 2K bytes). This makes fingerprint identification devices widely accepted in many applications.

There are also many types of sensing techniques for capturing fingerprint. The popular ones are optical type and capacitive type. Optical fingerprint sensing modules utilize reflected light intensity from the surface of a finger to tell where the ridges and valleys are on the contact portion of the finger. The advantage of the optical technique is reliability and low cost. However, due to the size of the embedded optical lens, the form factor of an optical fingerprint sensing module cannot be kept small. It is difficult for the optical type sensor to be embedded in portable devices. The capacitive type fingerprint identification modules, on the other hand, are made out of silicon chips and can be made very compact. In some cases, when a fingerprint image can be fetched by slide scanning, the fingerprint sensor can be even thin and slim, too. The small form factor of capacitive type fingerprint identification module makes it suitable for portable applications such as access control badges, bank cards, cellular phones, tablet computers, USB dongles, etc.

Capacitive fingerprint sensor is based on the principle that the capacitance of a two parallel conductive plates is inversely proportional to the distance between them. A capacitive fingerprint sensor consists of an array of sensing units. Each sensing unit contains a sensing plate. By using the sensing plate as one plate of the two-plated capacitor and a dermal tissue as another plate, ridges and valleys of a fingerprint can be located by measuring the different capacitances. There are many prior arts related to the capacitive type fingerprint identification module. Most of them have been applied to manufacture fingerprint sensors. However, there are also many problems pending for solutions. One of them is the accuracy of the sensing elements.

Due to the high density nature, the popular capacitive fingerprint sensors are mainly manufactured with semiconductor processes. The precision of the sensing elements is affected by many factors inherited in the process technology, such as density of chemical impurities, alignment of photo masks, equipment control, etc., whose uncertainty or variation will be reflected in the different behavior between devices, or even a fixed pattern noise seen in the captured fingerprint images of the same device. To achieve best performance of personal identification, it is desirable to improve the quality of the capture fingerprint image by reducing the noise pattern. A common practice to eliminate fixed pattern noise is to calibrate the device before use. The calibration data can be calculated and stored as part of the manufacturing process, or right before the device is being used. However in either case, a certain amount of memory storage space must be set aside for the calibration data, and this storage space will increase the system cost. Therefore, an innovative pixel sensing element, a capacitive fingerprint sensor made by the pixel sensing elements and a method for running the pixel sensing element are desirable.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

According to an aspect of the present invention, a capacitive image sensor is disclosed. The capacitive image sensor includes: a number of capacitive sensing elements, forming an array, each capacitive sensing element for transforming a distance between a portion of a surface of an approaching finger and a top surface thereof into an output voltage, wherein a value of the output voltage is changed by a driving signal exerted on the finger; an A/D converter, for converting the output voltage into a number and outputting the number; and a signal source, for providing the driving signal to the finger. The driving signal is a signal with voltage transition or transitions, formed by alternate positive waveform and negative waveform. The internal electric potential at each part of the capacitive sensing elements is initialized to a known constant value during a reset stage. The capacitive sensing elements receive the driving signal and convert it to an output voltage during a sensing stage. The A/D converter performs conversion during a measuring stage. A difference between two numbers converted from the output voltages occurred in each capacitive sensing element under one positive waveform and one negative waveform, respectively, is a noise-reduced value representing a pixel for the portion surface of the finger. Sequentially collect the noise-reduced values under the corresponding positive waveform and negative waveform of each pixel. Map the noise-reduced values to corresponding locations of capacitive sensing elements to obtain a noise-reduced image of the finger.

Preferably, shapes of the positive waveform and the negative waveform may be symmetrical. The positive waveform or the negative waveform may be a step function. The pixel image value may be a numeric value that corresponds to the gray level of the pixel.

In a first embodiment, the capacitive sensing element may further includes: a metal plate; a voltage follower, wherein an input end of the voltage follower is connected to the metal plate, and an output end of the voltage follower is connected to the A/D converter; a comparative capacitor, wherein one electrode of the comparative capacitor is electrically connected to the metal plate and the other electrode thereof is electrically connected to a ground end; a constant voltage source, for providing a constant bias voltage; and a constant bias voltage switch, connected to the constant voltage source and the metal plate, for switching supply of the constant bias voltage. The constant bias voltage switch is turned on during the reset stage and is turned off during the sensing stage and the measuring stage.

According to the present invention, a parasitic capacitance having a value of $C_p$ is formed between the metal plate and the ground end. The comparative capacitor has a value of $C_m$. A value of a reference capacitance, $C_r$, is obtained by $C_r=C_m+C_p$. When the finger is approaching the capacitive sensing element, a signal capacitance is formed by the finger and the signal source. A finger capacitance is formed by the finger and the metal plate. The output voltage, $V_{out}$, is obtained by $$V_{out} = V_{bias} + \frac{C_f}{C_f + C_r}V_{in}.$$

$V_{bias}$ is the value of the constant bias voltage. $V_{in}$ is a voltage change of the driving signal. $C_f$ is a value of the finger capacitance.

Preferably, the comparative capacitor is a MOSFET (Metal-Oxide-Semiconductor Field-Effect Transistor) capacitor, a PIP (Polysilicon-Insulator-Polysilicon) capacitor or a MIM (Metal-Insulator-Metal) capacitor.

In a second embodiment, the capacitive sensing element may further includes: a metal plate; a voltage follower, wherein an input end of the voltage follower is connected to the metal plate, and an output end of the voltage follower is connected to the A/D converter; a constant voltage source, for providing a constant bias voltage; and a constant bias voltage switch, connected to the constant voltage source and the metal plate, for switching supply of the constant bias voltage. The constant bias voltage switch is turned on during the reset stage and is turned off during the sensing stage and the measuring stage.

According to the present invention, a parasitic capacitance having a value of $C_p$ is formed between the metal plate and a ground end. A reference capacitor, $C_r$, equals to $C_p$. When the finger is approaching the capacitive sensing element, a signal capacitance is formed by the finger and the signal source. A finger capacitance is formed by the finger and the metal plate. The output voltage, $V_{out}$, is obtained by $$V_{out} = V_{bias} + \frac{C_f}{C_f + C_r}V_{in}.$$

$V_{bias}$ is the value of the constant bias voltage. $V_{in}$ is a voltage change of the driving signal. $C_f$ is a value of the finger capacitance.

In a third embodiment, the capacitive sensing element may further includes: a metal plate; a voltage follower, wherein an input end of the voltage follower is connected to the metal plate, and an output end of the voltage follower is connected to the A/D converter; a working voltage source, for providing a working voltage; a working voltage switch, connected to the working voltage source with a first end of the working voltage switch, for switching supply of the working voltage; a comparative capacitor, wherein one electrode of the comparative capacitor is electrically connected to a second end of the working voltage switch and the other electrode is electrically connected to a ground end; a charge sharing switch, electrically connected to the metal plate and the second end of the working voltage switch, to balance electric charges in both ends when turned on; and a ground switch, for releasing electric charges accumulated in the capacitive sensing element to the ground end when turned-on, and for accumulating electric charges in the capacitive sensing element when turned-off. The working voltage switch is turned on during the reset stage and is turned off during the sensing stage and the measuring stage.

The charge sharing switch is turned off during the reset stage and is turned on during the sensing stage and the measuring stage. The ground switch is turned on during the reset stage and is turned off during the sensing stage and the measuring stage.

According to the present invention, a parasitic capacitance having a value of $C_p$ is formed between the metal plate and the ground end. The comparative capacitor has a value of $C_m$. When the finger is approaching the capacitive sensing element, a signal capacitance is formed by the finger and the signal source. A finger capacitance is formed by the finger and the metal plate. The output voltage, $V_{out}$, is obtained by $$V_{out} = \frac{C_m}{C_m + C_p + C_f}V_{dd} + \frac{C_f}{C_m + C_p + C_f}V_{in}.$$

$V_{dd}$ is the value of the working voltage. $V_{in}$ is a voltage change of the driving signal. $C_f$ is a value of the finger capacitance.

Preferably, the comparative capacitor may be a MOSFET capacitor, a PIP capacitor or a MIM capacitor.

A method for operating the capacitive image sensor includes the steps of: resetting the capacitive sensing elements to be capable of sensing in a first reset stage; exerting the driving signal having a first waveform to the capacitive sensing elements via the finger in a first sensing stage; reading numbers converted from the output voltages from every capacitive sensing elements in a first measuring stage; resetting the capacitive sensing elements to be capable of sensing in a second reset stage; exerting the driving signal having a second waveform to the capacitive sensing elements via the finger in a second sensing stage; reading numbers converted from the output voltages from every capacitive sensing elements in a second measuring stage; subtracting the numbers obtained from the same capacitive sensing element under different measuring stages to have the noise-reduced values; sequentially collecting the noise-reduced values under the corresponding positive waveform and negative waveform of each pixel; and mapping the noise-reduced values to corresponding locations of capacitive sensing elements. If the first waveform is a positive waveform, then the second waveform is a negative waveform; if the first waveform is a negative waveform, then the second waveform is a positive waveform.

A method for operating the capacitive image sensor in the first embodiment includes the steps of: turning on the constant bias voltage switch in a first reset stage; turning off the constant bias voltage switch and exerting the driving signal having a first waveform to the capacitive sensing element via the finger in a first sensing stage; sending a first output voltage to the A/D converter in a first measuring stage; turning on the constant bias voltage switch in a second reset stage; turning off the constant bias voltage switch and exerting the driving signal having a second waveform to the capacitive sensing element via the finger in a second sensing stage; and sending a second output voltage to the A/D converter in a second measuring stage. If the first waveform is a positive waveform, then the second waveform is a negative waveform; if the first waveform is a negative waveform, then the second waveform is a positive waveform.

A method for operating the capacitive image sensor in the second embodiment includes the steps of: turning on the constant bias voltage switch in a first reset stage; turning off the constant bias voltage switch and exerting the driving signal having a first waveform to the capacitive sensing element via the finger in a first sensing stage; sending a first output voltage to the A/D converter in the a first measuring stage; turning on the constant bias voltage switch in a second reset stage; turning off the constant bias voltage switch and exerting the driving signal having a second waveform to the capacitive sensing element via the finger in a second sensing stage; and sending a second output voltage to the A/D converter in a second measuring stage. If the first waveform is a positive waveform, then the second waveform is a negative waveform; if the first waveform is a negative waveform, then the second waveform is a positive waveform.

A method for operating the capacitive image sensor in the third embodiment includes the steps of: turning on the working voltage switch and the ground switch, and turning off the charge sharing switch in a first reset stage; turning off the working voltage switch and the ground switch first, then turning on the charge sharing switch and exerting the driving signal having a first waveform to the capacitive sensing element via the finger in a first sensing stage; sending a first output voltage to the A/D converter in a first measuring stage; turning on the working voltage switch and the ground switch, and turning off the charge sharing switch in a second reset stage; turning off the working voltage switch and the ground switch first, then turning on the charge sharing switch and exerting the driving signal having a second waveform to the capacitive sensing element via the finger in a second sensing stage; and sending a second output voltage to the A/D converter in a second measuring stage. If the first waveform is a positive waveform, then the second waveform is a negative waveform; if the first waveform is a negative waveform, then the second waveform is a positive waveform.

DETAILED DESCRIPTION OF THE PREFERRED EMBODIMENTS

The present invention will now be described more specifically with reference to the following embodiments.

Figure 1:
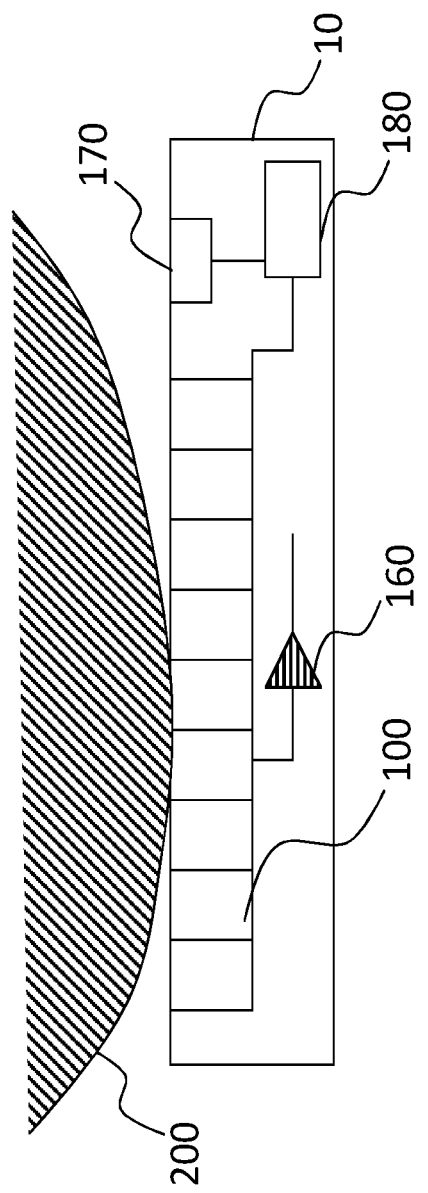
FIG. 1 is a schematic diagram of a capacitive image sensor according to the present invention.

Please see FIG. 1. FIG. 1 shows a schematic diagram of a capacitive image sensor 10 according to the present invention. The capacitive image sensor 10 is used to depict ridges and valleys of a surface of a finger 200, further converting the results into a noise-reduced image of the fingerprint. There are many electronic components to implement the capacitive image sensor 10. The main components include a number of capacitive sensing elements 100, an A/D converter 160, a signal source 170 and a controller 180. Below are the descriptions for the functions of each main component.

The capacitive sensing elements 100 form an array. Each capacitive sensing element 100 can be used to transform a distance between a portion of a surface of the approaching finger 200 and a top surface of itself into an output voltage. Details about how to generate the output voltage will be illustrated later. A value of the output voltage may change according to the distance therebetween and can be enhanced by a driving signal exerted on the finger 200. The driving signal can be used to reduce noises when sensing the finger 200. The A/D converter 160 converts the output voltage into a number and outputs the number. The number is a digitized value. The signal source 170 can provide said driving signal to the finger 200. In practice, the signal source 170 may include a metal frame or metal strips (not shown) around the capacitive sensing elements 100. The top surface area of the signal source 170 should be large enough for a finger to contact, and the impedance therebetween is so small that it can be ignored. In a simple way, the signal source 170 may also be a metal bar which can be touched by the finger 200 when the capacitive sensing elements 100 are sensing. The controller 180 may control the states of each capacitive sensing element 100 and cooperate with the signal source 170 to get the noise-reduced image.

Figure 2:
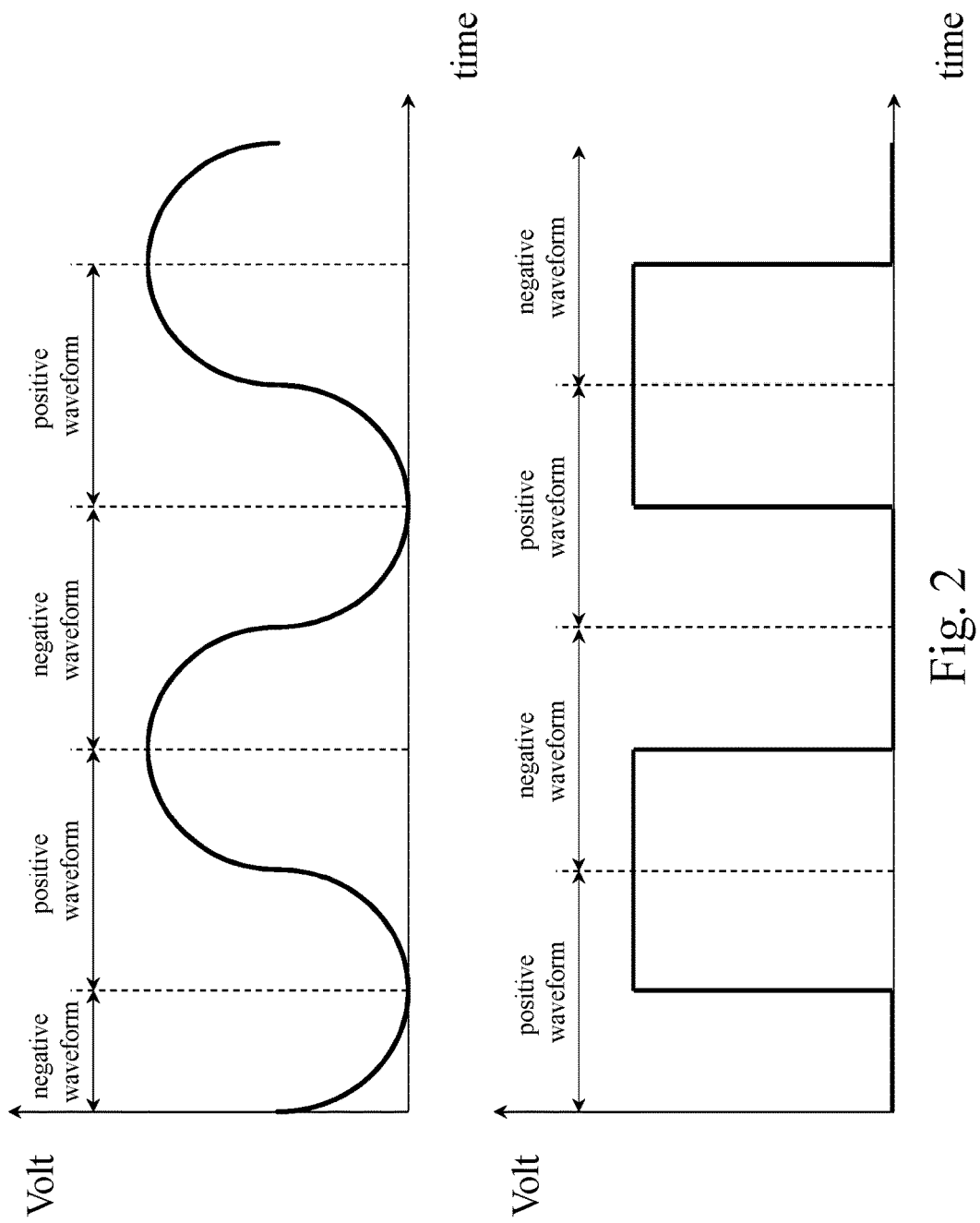
FIG. 2 shows different aspects of the driving signal.

Here, the driving signal is a signal with voltage transition or transitions. It is formed by alternate positive waveform and negative waveform. Voltage of the positive waveform is increasing with time while voltage of the negative waveform is decreasing with time. Shapes of the positive waveform and the negative waveform should be symmetrical. Please see FIG. 2. FIG. 2 shows different aspects of the driving signal with different positive waveforms and negative waveforms. The driving signal shown in the upper side of FIG. 2 has a smoothly changing shape. Positive waveforms and negative waveforms are marked separately. However, the driving signal may be exerted in a sharply changing manner as shown in the lower side of FIG. 2. Preferably, the positive waveform or the negative waveform is a step function. Internal electric potential at each part of the capacitive sensing elements 100 is initialized by applying a constant voltage, which provides the bias voltage of the sensing elements, to a known constant value during a reset stage. The capacitive sensing elements 100 receive the driving signal and convert it to an output voltage during a sensing stage. The A/D converter 160 performs conversion during a measuring stage. The reset stage, sensing stage and measuring stage are the states of the capacitive sensing elements 100 and will be explained in details along with the description of the capacitive sensing elements 100 later. A difference between two numbers converted from the output voltages occurred in each capacitive sensing element 100 under one positive waveform and one negative waveform, respectively, is a noise-reduced value. The noise-reduced value represents a pixel for the portion of the surface of the finger 200. Namely, the portion of the surface of the finger 200 is the portion just above the capacitive sensing element 100 which is sensing said portion of the surface of the finger 200.

A noise-reduced image of the finger 200 (fingerprint) can be obtained by: sequentially collecting the noise-reduced values under the corresponding positive waveform and negative waveform of each pixel, and mapping the noise-reduced values to corresponding locations of capacitive sensing elements 100.

Preferably, the pixel image value is a numeric value that corresponds to the gray level of the pixel. Thus, any portion of the finger 200 can be presented by a specific grayscale, representing the distance between the capacitive sensing element 100 and the portion of the finger 200 above it. A fingerprint image can be obtained.

Figure 3:
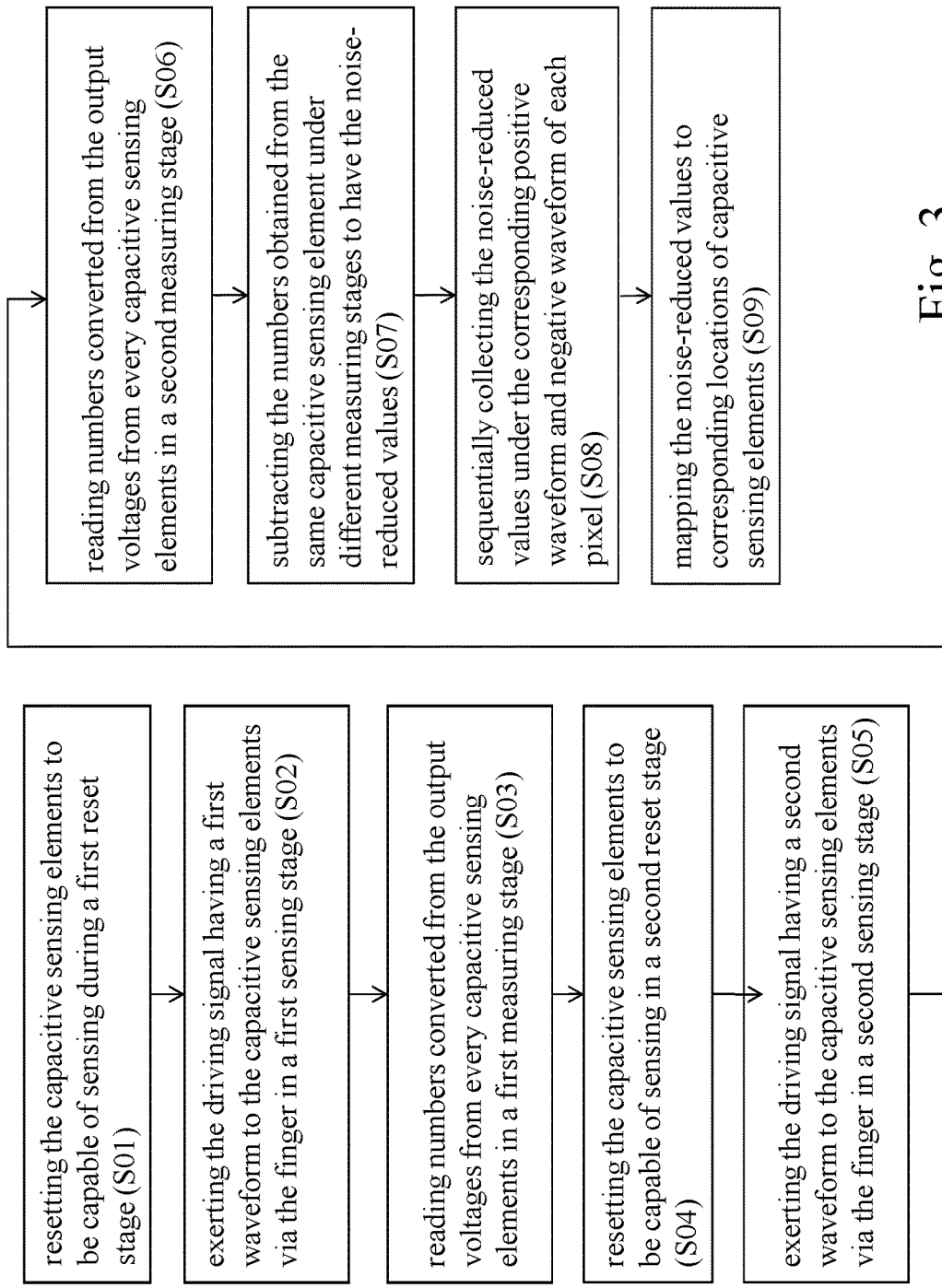
FIG. 3 is a flow chart illustrating a procedure to operate the capacitive image sensor.

The procedure to operate the capacitive image sensor 10 is illustrated by the flow chart in FIG. 3. A first step is to reset the capacitive image elements 100 to be capable of sensing in a first reset stage (S01). Here, "capable of sensing" means the capacitive image elements 100 are ready for sensing and can also be called ready state. The ready state may be different for different implementations (or embodiments) of the present invention. Then, exert the driving signal which has a first waveform to the capacitive sensing elements 100 via the finger 200 in a first sensing stage (S02). The first waveform, for example, is a positive waveform. A third step is reading numbers converted from the output voltages from every capacitive sensing elements 100 in a first measuring stage (S03). Step S03 may be carried out by the controller 180 or other specific element designed for this job. Next, reset the capacitive sensing elements 100 to be capable of sensing in a second reset stage (S04). Again, the capacitive sensing elements 100 are in the status of capable of sensing for the following steps. Exert the driving signal which a second waveform to the capacitive sensing elements 100 via the finger 200 in a second sensing stage (S05). The second waveform is a negative waveform. Similarly, read numbers converted from the output voltages from every capacitive sensing elements 100 in a second measuring stage (S06). After two cycles of collecting numbers from said capacitive sensing elements 100, subtract the numbers obtained from the same capacitive sensing element 100 under different measuring stages, namely, from the first and second measuring stages to have the noise-reduced values (S07). Then, sequentially collect the noise-reduced values under the corresponding positive waveform and negative waveform of each pixel (S08). Finally, map the noise-reduced values to corresponding locations of capacitive sensing elements 100 to get the noise-reduced image of the finger 200 (fingerprint). It should be noticed that if the first waveform is a positive waveform, then the second waveform is a negative waveform. Otherwise, if the first waveform is a negative waveform, then the second waveform is a positive waveform. Again, the positive waveform and the negative waveform should be symmetrical.

Figure 4:
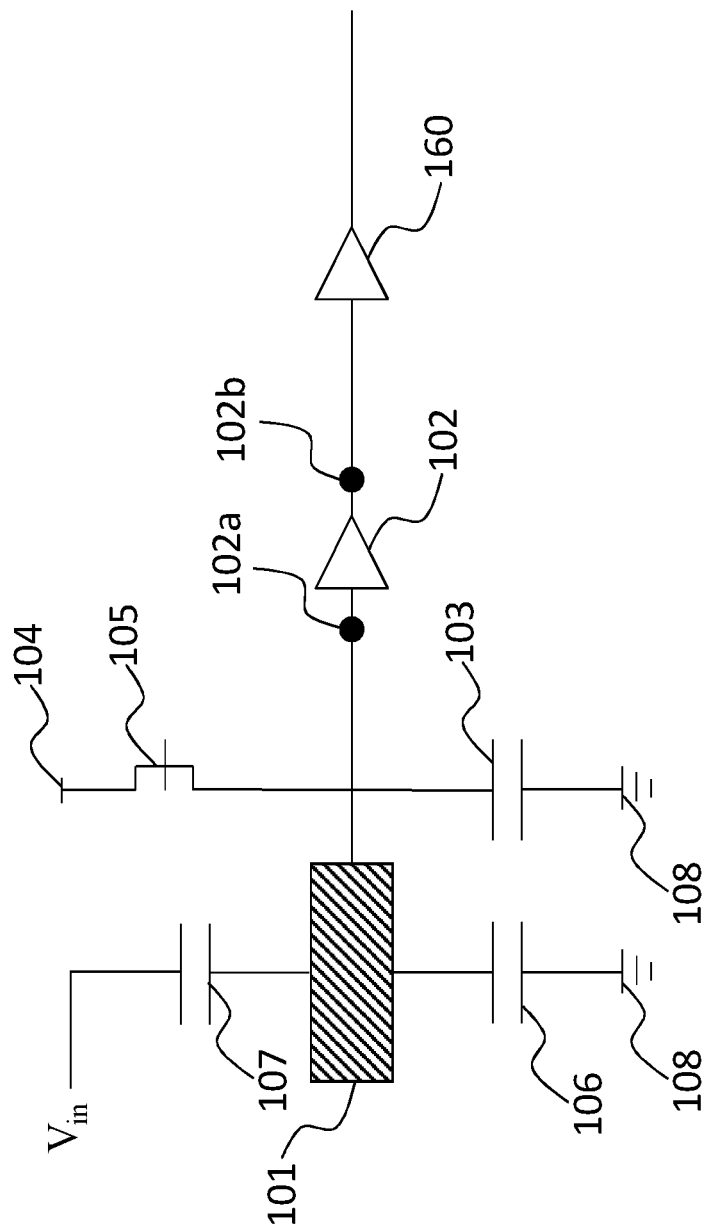
FIG. 4 shows an equivalent circuit of a design of the capacitive sensing element of a first embodiment.

In a first embodiment, an equivalent circuit of a design of the capacitive sensing element 100 is shown in FIG. 4. The capacitive sensing element 100 is basically composed of a metal plate 101, a voltage follower 102, a comparative capacitor 103, a constant voltage source 104 and a constant bias voltage switch 105. There are many parasitic capacitances naturally formed the metal plate 101 and other metal layers in the sensor (not shown), a net effect of all the parasitic capacitances can be considered as one single equivalent capacitor, having a value of $C_p$, formed between the metal plate 101 and the ground end 108. The parasitic capacitance inevitably exists in the capacitive sensing elements 100. However, its capacitance, $C_p$, can be well controlled under proper design such that the parasitic capacitance in every capacitive sensing element 100 has the same value. An equivalent parasitic capacitor 106 is used to denote the parasitic capacitance. When the finger 200 is approaching the capacitive sensing element 100, a signal impedance is formed between the finger 200 and the signal source (not shown), and a finger capacitance is formed by the finger 200 and the metal plate 101. Because the overlapping area between the signal source and the finger is much larger than that of a single metal plate 101 of the capacitive sensing element 100, the signal impedance is so small that it is negligible. An equivalent finger capacitor 107 is used to denote the finger capacitance. A voltage change of the driving signal (value of $V_{in}$ and produced by the change of waveforms) can be exerted to the capacitive sensing element 100 via the finger 200. An input end 102a of the voltage follower 102 is connected to the metal plate 101 while an output end 102b of the voltage follower 102 is connected to the A/D converter 160. The voltage follower 102 gives effective isolation for the output end 102b from the input end 102a, connected to the metal plate 101, to avoid drawing power form the input end 102a, and is better designed as close to an ideal voltage follower as possible. The comparative capacitor 103 is implemented by circuit elements such as MOSFET (Metal-Oxide-Semiconductor Field-Effect Transistor) capacitor. It can also be a PIP (Polysilicon-Insulator-Polysilicon) capacitor or a MIM (Metal-Insulator-Metal) capacitor. One electrode of the comparative capacitor 103 is electrically connected to the metal plate 101 and the other electrode of the comparative capacitor 103 is electrically connected to the ground end 108. The comparative capacitor 103 has a value of $C_m$. The constant voltage source 104 is used to provide a constant bias voltage. The constant bias voltage switch 105 is connected to the constant voltage source 104 and the metal plate 101, for switching supply of the constant bias voltage. The constant bias voltage switch 105 is turned on during the reset stage. At this stage, the constant bias voltage is applied to the metal plate 101, the comparative capacitor 103, and the parasitic capacitor 106 to establish proper operating conditions for the capacitive sensing element 100. The constant bias voltage switch 105 is turned off during the sensing stage and the measuring stage.

Figure 5:
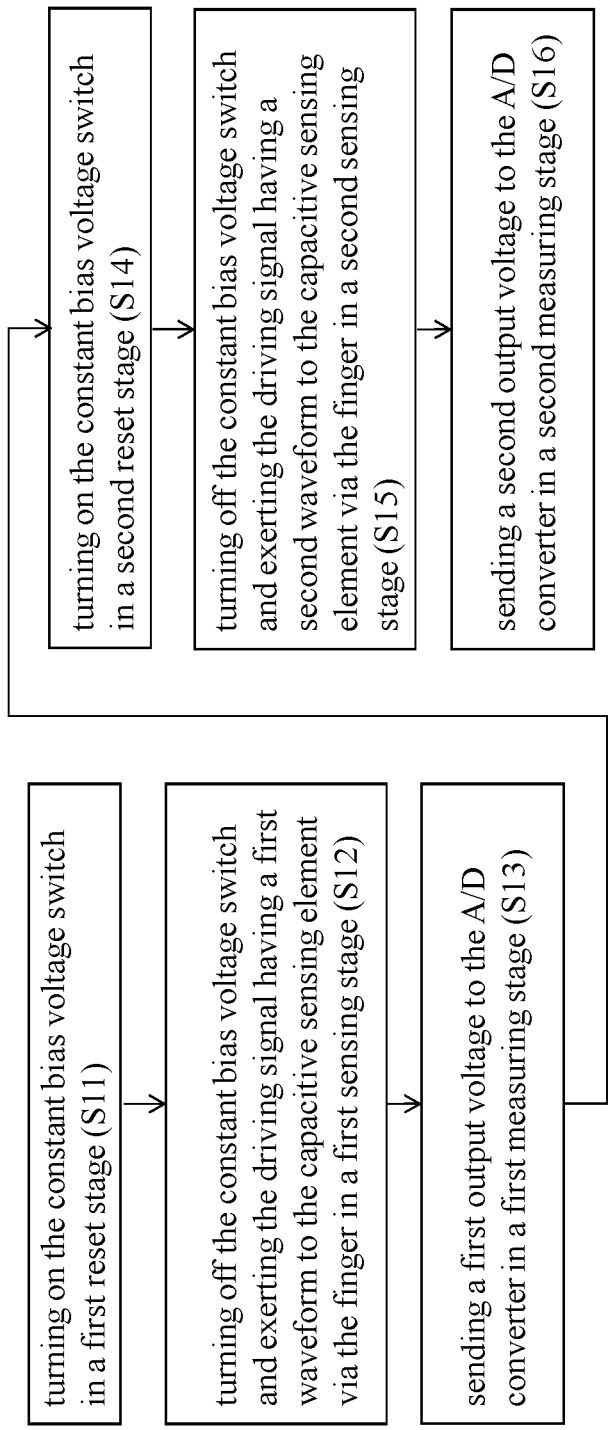
FIG. 5 is a flow chart illustrating a procedure to operate the capacitive sensing element in the first embodiment.

The procedure to operate the capacitive sensing element 100 in this embodiment is illustrated by the flow chart in FIG. 5. First, turn on the constant bias voltage switch 105 in a first reset stage (S11). The constant voltage source 104 provides the bias voltage for the circuit in the capacitive sensing element 100. The capacitive sensing element 100 can start sensing operation. Then, turn off the constant bias voltage switch 105 and exert the driving signal which has a first waveform to the capacitive sensing element 100 via the finger 200 in a first sensing stage (S12). It is clear that the sensing stage is the time when the driving signal is applied for the capacitive sensing element 100 to get the output voltage (sensing stages used in the description of the present invention mean the same condition). Next, send a first output voltage to the A/D converter 160 in a first measuring stage (S13). During the measuring stage, the output voltage is sent to the A/D converter 160 and the A/D converter 160 converts all received output voltages from those capacitive sensing elements 100 in the measuring stage to respective numbers (measuring stages used in the description of the present invention mean the same condition). The following steps are turning on the constant bias voltage switch 105 in a second reset stage (S14), turning off the constant bias voltage switch 105 and exerting the driving signal which has a second waveform to the capacitive sensing element 100 via the finger 200 in a second sensing stage (S15), and sending a second output voltage to the A/D converter 160 in a second measuring stage (S16). Basically, step S14 to S16 repeat the actions from step S11 to S13. The only difference between the two cycles is different waveforms are applied. Similarly, if the first waveform is a positive waveform, then the second waveform is a negative waveform. Otherwise, if the first waveform is a negative waveform, then the second waveform is a positive waveform. The two consequent waveforms must be symmetrical in shape.

The output voltage, $V_{out}$, at the input end 102a of the voltage follower 102 can be obtained by $$V_{out} = V_{bias} + \frac{C_f}{C_f + C_r}V_{in}.$$

Figure 6:
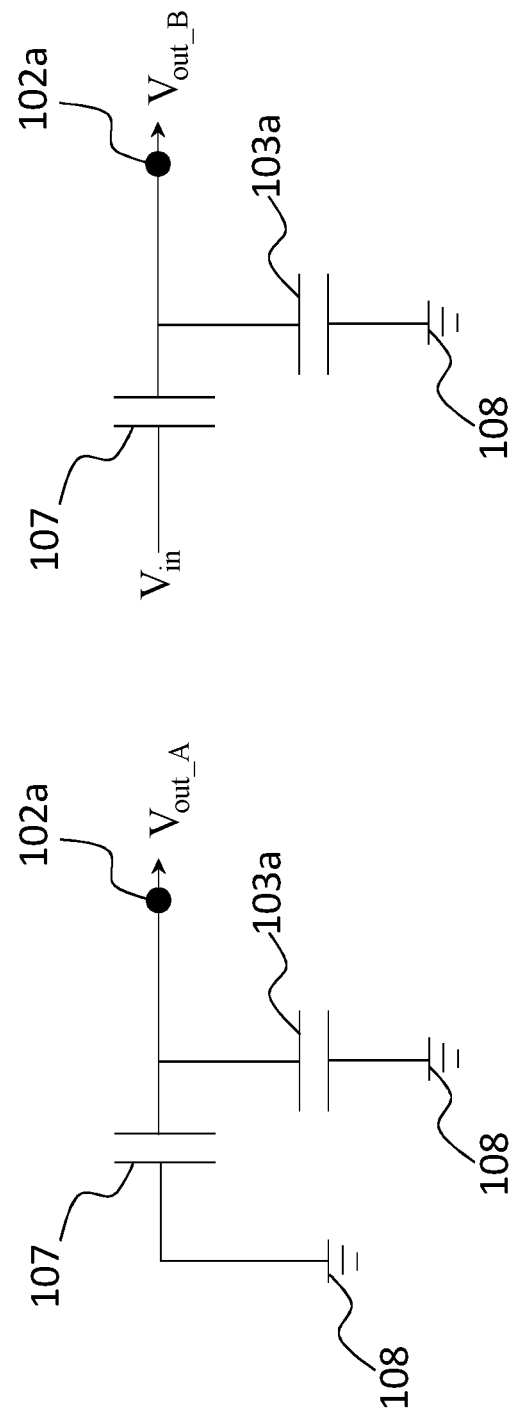
FIG. 6 shows the linear superposition of two voltages in the first embodiment.

$V_{bias}$ is the value of the constant bias voltage, $V_{in}$ is a voltage change of the driving signal, and $C_f$ is a value of the finger capacitance (equivalent finger capacitor 107). A value of a reference capacitance, $C_r$, is obtained by $C_r = C_m + C_p$. Derivation of the above formula is illustrated below. The circuit in FIG. 4 is a linear circuit. Therefore, the output voltage can be written as a linear combination of two terms: the first term represents the part affected by the constant voltage $V_{bias}$, and the second term represents the part affected by the voltage change $V_{in}$. On the left of FIG. 6 is a simplified circuit of the first term, where the reference capacitor 103a (a combination of the comparative capacitor 103 and the equivalent parasitic capacitor 106) and the finger capacitor 107 has been charged to the constant voltage, $V_{bias}$. A first voltage output, $V_{out\_A}$, can be obtained by $V_{out\_A} = V_{bias}$. On the right of FIG. 6 is a simplified circuit of the second term when $V_{in}$ is applied. A second voltage output, $V_{out\_B}$, can be obtained by $$V_{out\_B} = \frac{C_f}{C_f + C_m + C_p}V_{in} = \frac{C_f}{C_f + C_r}V_{in}.$$

Since $V_{out}$ is the linear superposition of $V_{out\_A}$ and $V_{out\_B}$, $$V_{out} = V_{out\_A} + V_{out\_B} = V_{bias} + \frac{C_f}{C_f + C_r}V_{in}.$$

Since all parameters but $C_f$ in the equation above are known, $V_{out}$ is a function of $C_f$ representing the distance between the metal plate 101 in a capacitive sensing element 100 and the portion of the surface of the finger 200 above it. By collecting all outputs from every capacitive sensing elements 100 and converting the outputs to numbers as grayscale values, a fingerprint image can be obtained.

In a second embodiment, the capacitive sensing element has different design but the same operation procedure. The capacitive image sensor 10 can be configured with this different capacitive sensing element while its operation procedure doesn't change. Below is an illustration about the second kind of capacitive sensing element.

Figure 7:
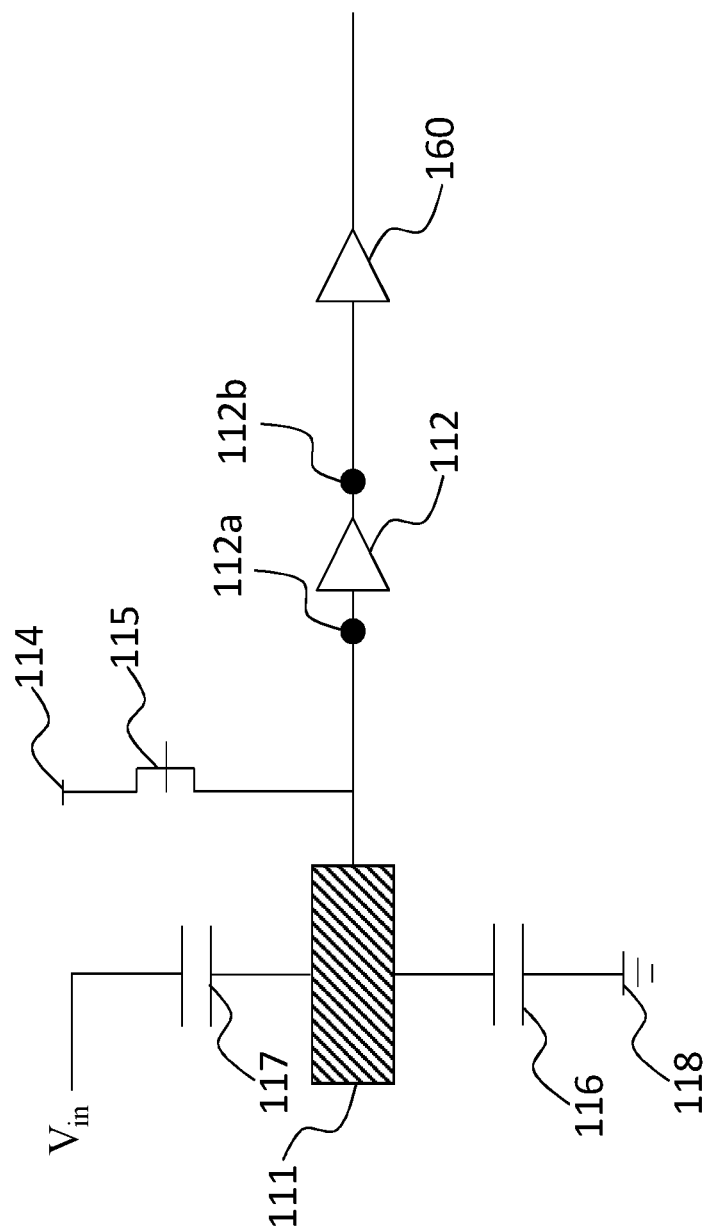
FIG. 7 shows an equivalent circuit of a design of the capacitive sensing element of a second embodiment.

In this embodiment, an equivalent circuit of a design of the capacitive sensing element 100 is shown in FIG. 7. Structure of the capacitive sensing element 100 is changed and basically composed of a metal plate 111, a voltage follower 112, a constant voltage source 114 and a constant bias voltage switch 115. Obviously, there is no comparative capacitor used in this design. There are many parasitic capacitances naturally formed the metal plate 111 and other metal layers in the sensor (not shown), a net effect of all the parasitic capacitances can be considered as one single equivalent capacitor, having a value of $C_p$, formed between the metal plate 111 and the ground end 118. Similarly, $C_p$ can be well controlled under proper design such that the parasitic capacitance in every capacitive sensing element 100 has the same value, and is used as a reference capacitance, i.e. $C_r = C_p$. An equivalent parasitic capacitor 116 is used to denote the parasitic capacitance. When the finger 200 is approaching the capacitive sensing element 100, a signal impedance is formed between the finger 200 and the signal source (not shown), and a finger capacitance is formed by the finger 200 and the metal plate 111. The signal impedance is so small that it is negligible. An equivalent finger capacitor 117 is used to denote the finger capacitance. A voltage change of the driving signal (value of $V_{in}$ and produced by change of waveforms) can be exerted to the capacitive sensing element 100 via the finger 200. An input end 112a of the voltage follower 112 is connected to the metal plate 111 while an output end 112b of the voltage follower 112 is connected to the A/D converter 160. Functions of the voltage follower 112 are the same as that of the voltage follower 102 in the previous embodiment. The constant voltage source 114 is used to provide a constant bias voltage. The constant bias voltage switch 115 is connected to the constant voltage source 114 and the metal plate 111, for switching supply of the constant bias voltage. The constant bias voltage switch 115 is turned on in the reset stage. At this stage, the constant bias voltage is applied to the metal plate 111 and the parasitic capacitor 116 to establish proper operating conditions for the capacitive sensing element 100. The constant bias voltage switch 115 is turned off during the sensing stage and the measuring stage.

Figure 8:
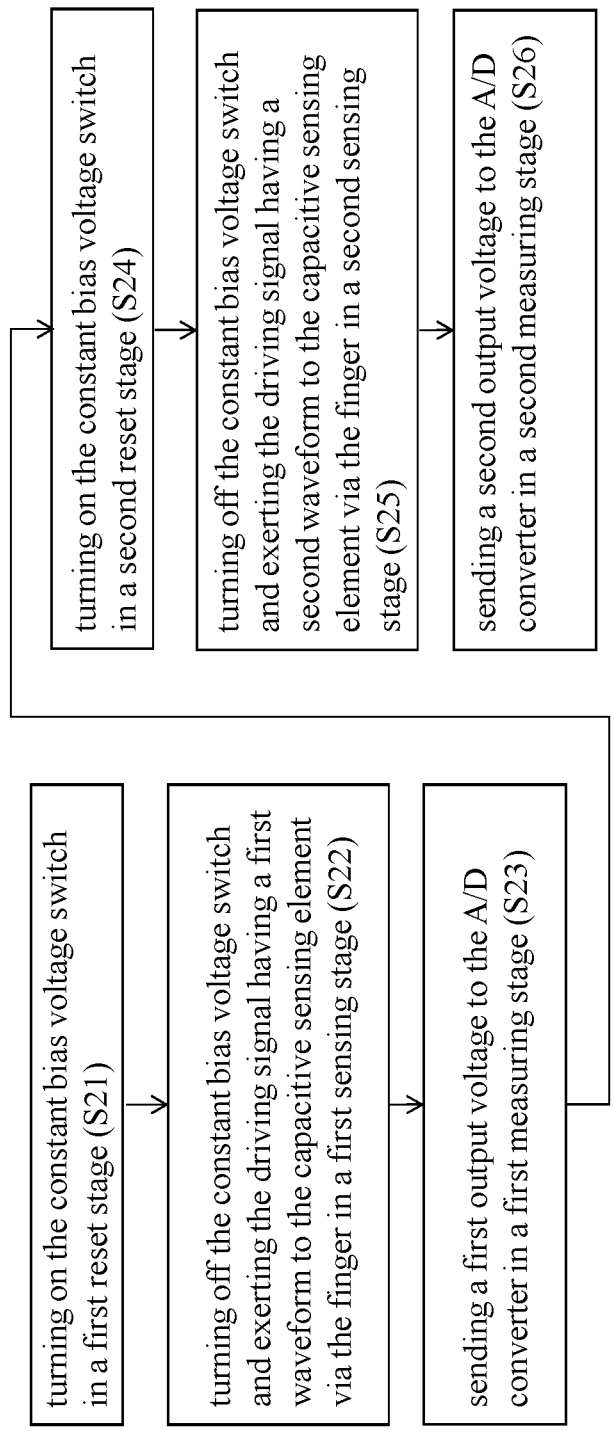
FIG. 8 is a flow chart illustrating a procedure to operate the capacitive sensing element in the second embodiment.

The procedure to operate the capacitive sensing element 100 in this embodiment is illustrated by the flow chart in FIG. 8. First, turn on the constant bias voltage switch 115 in a first reset stage (S21). Like the previous embodiment, the constant voltage source 114 provides the bias voltage for the circuit in the capacitive sensing element 100. The capacitive sensing element 100 can start sensing operation. Then, turn off the constant bias voltage switch 115 and exert the driving signal which has a first waveform to the capacitive sensing element 100 via the finger 200 in a first sensing stage (S22). Next, send a first output voltage to the A/D converter 160 in a first measuring stage (S23). The following steps are turning on the constant bias voltage switch 115 in a second reset stage (S24), turning off the constant bias voltage switch 115 and exerting the driving signal which has a second waveform to the capacitive sensing element 100 via the finger 200 in a second sensing stage (S25), and sending a second output voltage to the A/D converter 160 in a second measuring stage (S26). Step S24 to S26 repeat the actions in step S21 to S23. The only difference between the two cycles is different waveforms are applied. Similarly, if the first waveform is a positive waveform, then the second waveform is a negative waveform. Otherwise, if the first waveform is a negative waveform, then the second waveform is a positive waveform. The two consequent waveforms must be symmetrical in shape.

The output voltage, $V_{out}$, at the input end 112a of the voltage follower 112 can be obtained by $$V_{out} = V_{bias} + \frac{C_f}{C_f + C_r}V_{in}.$$

Figure 9:
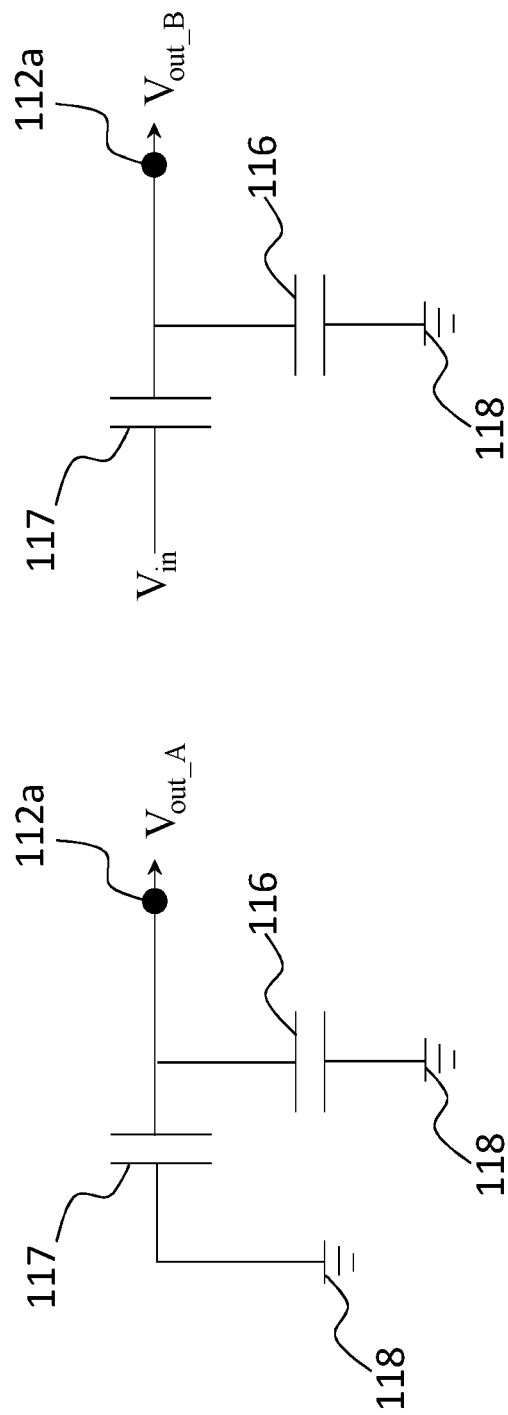
FIG. 9 shows the linear superposition of two voltages in the second embodiment.

Based on the same definitions, $V_{bias}$ is the value of the constant bias voltage, $V_{in}$ is a voltage change of the driving signal and $C_f$ is a value of the finger capacitance (equivalent finger capacitor 117). However, a value of a reference capacitance, $C_r$, equals to $C_p$ since there is no comparative capacitor in this embodiment. Derivation of the above formula is illustrated below. The circuit in FIG. 7 is a linear circuit. Therefore, the output voltage can be written as a linear combination of two terms: the first term represents the part affected by the constant voltage $V_{bias}$, and the second term represents the part affected by the voltage change $V_{in}$. On the left of FIG. 9 is a simplified circuit of the first term, where the reference capacitor 116 (the parasitic capacitor 116 is the reference capacitor in this embodiment) and the finger capacitor 117 has been charged to the constant voltage, $V_{bias}$. A first voltage output, $V_{out\_A}$, can be obtained by $V_{out\_A} = V_{bias}$. On the right of FIG. 9 is a simplified circuit of the second term when $V_{in}$ is applied. A second voltage output, $V_{out\_B}$, can be obtained by $$V_{out\_B} = \frac{C_f}{C_f + C_p} V_m = \frac{C_f}{C_f + C_r} V_{in}.$$

Since $V_{out}$ is the linear superposition of $$V_{out\_A} \text{ and } V_{out\_B}, V_{out} = V_{out\_A} + V_{out\_B} = V_{bias} + \frac{C_f}{C_f + C_r} V_{in}.$$

Since all parameters but $C_f$ in the equation above are known, $V_{out}$ is a function of $C_f$ representing the distance between the metal plate 111 in a capacitive sensing element 100 and the portion of the surface of the finger above it. By collecting all outputs from every capacitive sensing elements 100 and converting the outputs to numbers as grayscale values, a fingerprint image can be obtained.

In a third embodiment, the capacitive sensing element has different design and different operation procedure. However, the capacitive image sensor 10 can be configured with this different capacitive sensing element while its operation procedure doesn't change. Below is an illustration about the third kind of capacitive sensing element.

Figure 10:
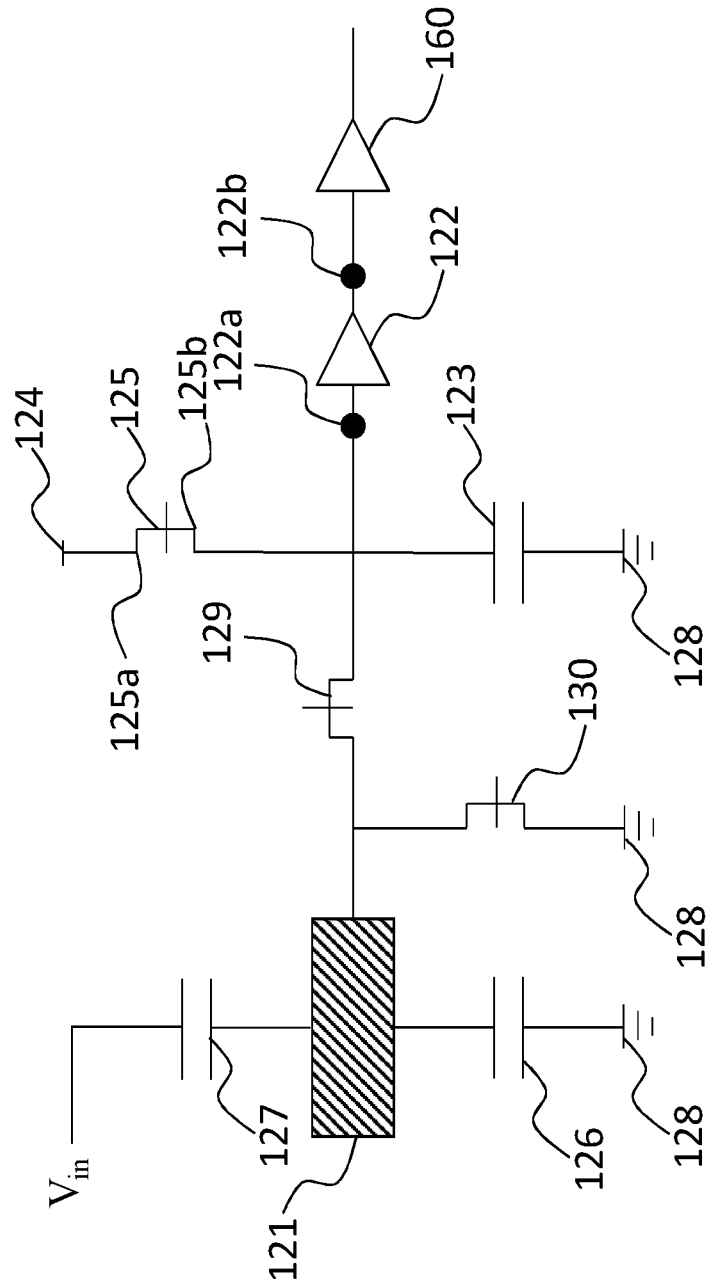
FIG. 10 shows an equivalent circuit of a design of the capacitive sensing element of a third embodiment.

Please see FIG. 10. FIG. 10 shows an equivalent circuit of a design of the capacitive sensing element 100. The capacitive sensing element 100 mainly has a metal plate 121, a voltage follower 122, a comparative capacitor 123, a working voltage source 124, a working voltage switch 125, a charge sharing switch 129 and a ground switch 130. Functions of the metal plate 121 and the voltage follower 122 are the same as their counterparts in the previous embodiments. An input end 122a of the voltage follower 122 is connected to the charge sharing switch 129 while an output end 122b of the voltage follower 122 is connected to the A/D converter 160. The comparative capacitor 123 is implemented by circuit elements such as MOSFET capacitor. It can also be a PIP capacitor or a MIM capacitor. One electrode of the comparative capacitor 123 is electrically connected to a second end 125b of the working voltage switch 125 and the other electrode of the comparative capacitor 123 is electrically connected to a ground end 128. The comparative capacitor 123 has a capacitance of $C_m$. The working voltage source 124 can provide a working voltage for the circuit in the capacitive sensing element 100 to operate. The working voltage switch 125 is connected to the working voltage source 124 with a first end 125a. It is used for switching supply of the working voltage. The charge sharing switch 129 is electrically connected to the metal plate 121 and the second end 125b of the working voltage switch 125. It switches to balance electric charges in both ends when turned on. The ground switch 130 is used to release electric charges accumulated in the capacitive sensing element 100 to the ground end 128 when it is turned-on. The ground switch 130 can let the capacitive sensing element 100 accumulate electric charges when it is turned-off. The working voltage switch 125 and the ground switch 130 are turned on in the reset stage and are turned off in the sensing stage and the measuring stage. The charge sharing switch 129 is turned off in the reset stage and is turned on in the sensing stage and the measuring stage. There are many parasitic capacitances naturally formed the metal plate 121 and other metal layers in the sensor (not shown), a net effect of all the parasitic capacitances can be considered as one single equivalent capacitor, having a value of $C_p$, formed between the metal plate 121 and the ground end 128. It can be presented by an equivalent parasitic capacitor 126 to the ground end 128. When the finger 200 is approaching the capacitive sensing element 100, a signal impedance is formed between the finger 200 and the signal source (not shown), and a finger capacitance is formed by the finger 200 and the metal plate 121. The signal impedance is so small that it is negligible, and the finger capacitance can be presented by an equivalent finger capacitor 127.

Figure 11:
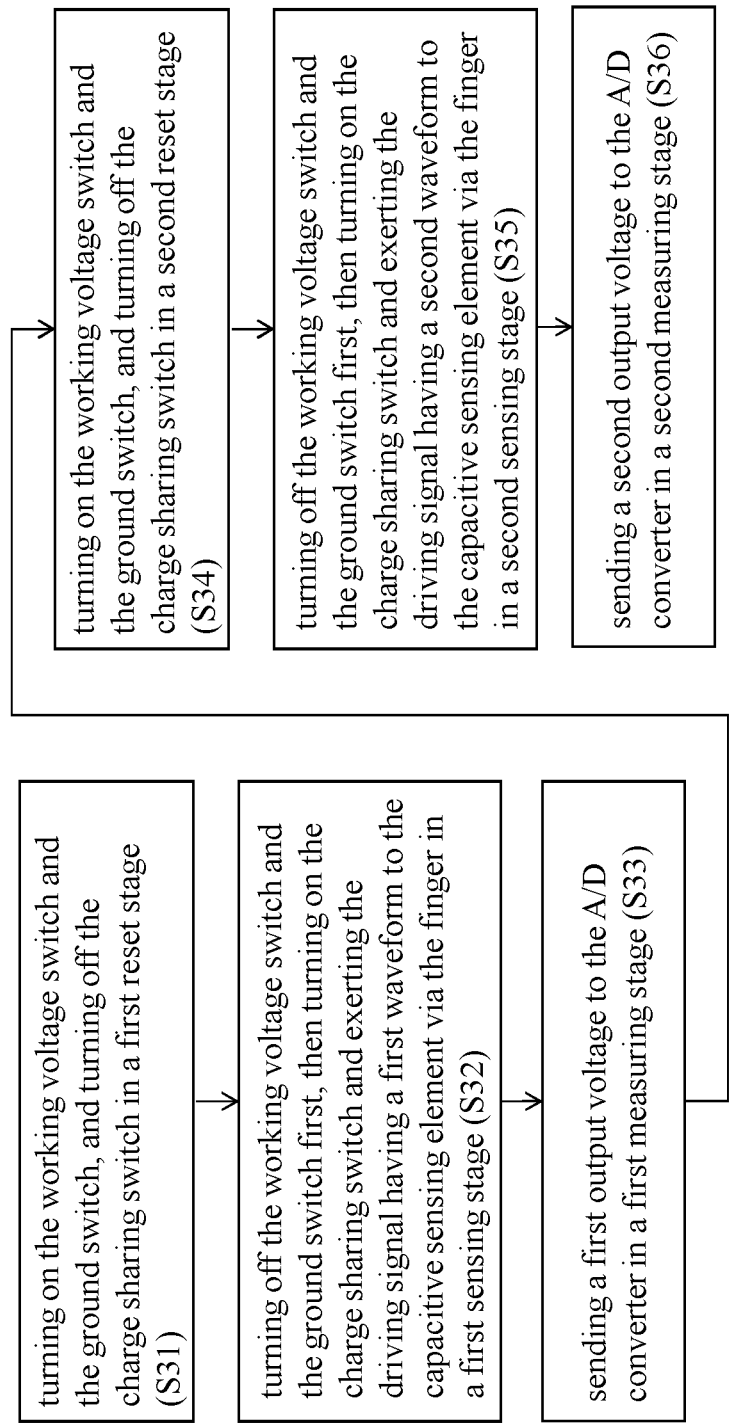
FIG. 11 is a flow chart illustrating a procedure to operate the capacitive sensing element in the third embodiment.

The procedure to operate the capacitive sensing element 100 in this embodiment is illustrated by the flow chart in FIG. 11. First, turn on the working voltage switch 125 and the ground switch 130, and turn off the charge sharing switch 129 in a first reset stage (S31). Unlike the previous embodiments, the operation is that the working voltage is applied to the comparative capacitor 123 rather than that the constant bias voltage is applied to both the reference capacitor and the finger capacitor. Once entering the sensing stage, the charges accumulated in the comparative capacitor 123 will change. Details about how charge redistribution affects output voltage will be illustrated later. Then, turn off the working voltage switch 125 and the ground switch 130 first, then turn on the charge sharing switch 129 and exert the driving signal which has a first waveform to the capacitive sensing element 100 via the finger 200 in a first sensing stage (S32). Next, send a first output voltage to the A/D converter 160 in a first measuring stage (S33). The following steps are turning on the working voltage switch 125 and the ground switch 130, and turning off the charge sharing switch 129 in a second reset stage (S34), turning off the working voltage switch 125 and the ground switch 130 first, then turning on the charge sharing switch 129 and exerting the driving signal which has a second waveform to the capacitive sensing element 100 via the finger 200 in a second sensing stage (S35), and sending a second output voltage to the A/D converter 160 in a second measuring stage (S36). Step S34 to S36 repeat the actions in step S31 to S33. The only difference between the two cycles is different waveforms are applied. Similarly, if the first waveform is a positive waveform, then the second waveform is a negative waveform. Otherwise, if the first waveform is a negative waveform, then the second waveform is a positive waveform. The two consequent waveforms must be symmetrical in shape.

The output voltage, $V_{out}$, at the input end 122a can be obtained by $$V_{out} = \frac{C_m}{C_m + C_p + C_f}V_{dd} + \frac{C_f}{C_m + C_p + C_f}V_{in}.$$

Figure 12:
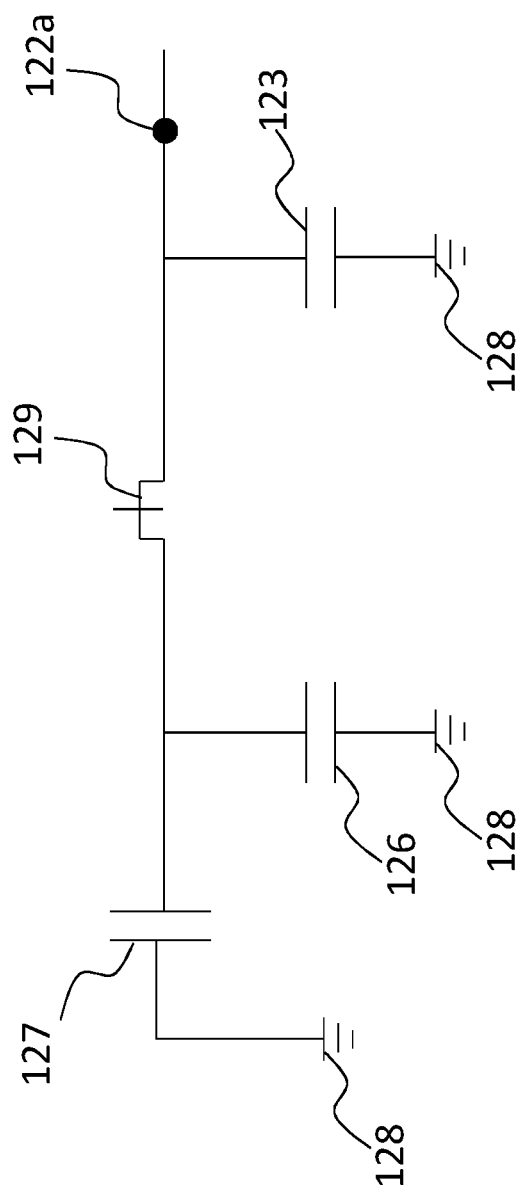
FIG. 12 shows an equivalent circuit of a first term in the design of the capacitive sensing element in the third embodiment.

$V_{dd}$ is the value of the working voltage, $V_{in}$ is a voltage change of the driving signal and $C_f$ is a value of the finger capacitance. Derivation of the above formula is illustrated below. The circuit in FIG. 10 is a linear circuit. Therefore, the output voltage can be written as a linear combination of two terms: the first term represents the part affected by the working voltage $V_{dd}$, and the second term represents the part affected by the voltage change $V_{in}$. The first term, $V_{out\_A}$, can also be called the "sharing term". In the reset stage, the comparative capacitor 123 is charged to the working voltage, $V_{dd}$. In the measuring stage, an equivalent circuit of the first term (sharing term) is shown in FIG. 12. In this stage, the charges accumulated in the comparative capacitor 123 before the charge sharing switch is turned on are redistributed. In other words, the charges are shared with the finger capacitor 127 and the parasitic capacitor 126 in the measuring stage (the charge sharing switch is turned on). When reaching stable equilibrium, the stable voltage, $$V_{out\_A} = \frac{C_m}{C_m + C_p + C_f}V_{dd}.$$

Figure 13:
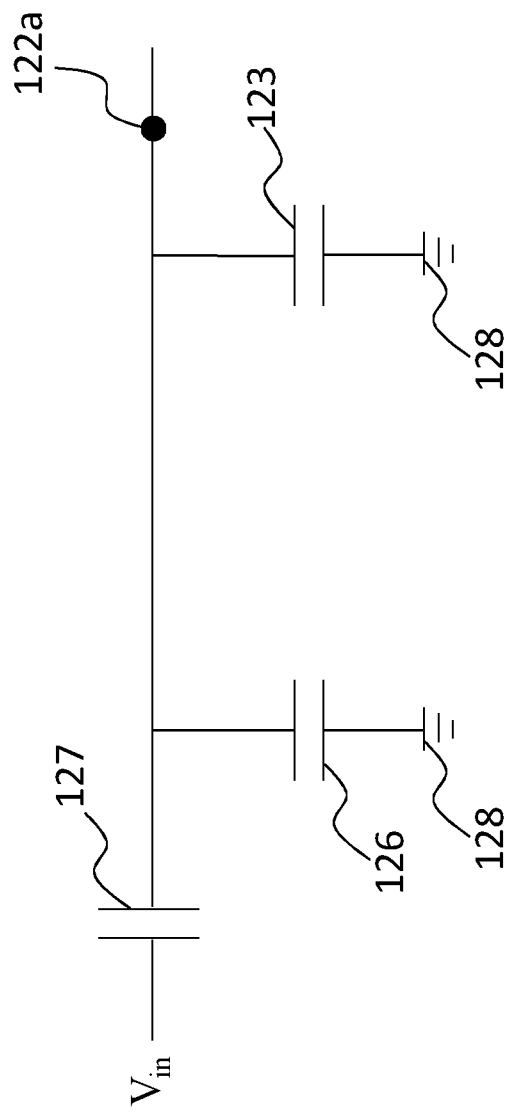
FIG. 13 shows an equivalent circuit of a second term in the design of the capacitive sensing element in the third embodiment.

A simplified equivalent circuit giving the relationship between the second term, $V_{out\_B}$, and the driving signal, $V_{in}$, is shown in FIG. 13, which represents the effect of the voltage change of the driving signal. The second voltage output (driving signal term), $V_{out\_B}$, can be obtained by $$V_{out\_B} = \frac{C_f}{C_m + C_p + C_f}V_{in}.$$

Since $V_{out}$ is the linear superposition of $V_{out\_A}$ and $V_{out\_B}$, $$V_{out} = V_{out\_A} + V_{out\_B} = \frac{C_m}{C_m + C_p + C_f}V_{dd} + \frac{C_f}{C_m + C_p + C_f}V_{in}.$$

Since all parameters but $C_f$ in the equation above are known, $V_{out}$ is a function of $C_f$ representing the distance between the metal plate 121 in a capacitive sensing element 100 and the portion of the surface of the finger above it. By collecting all outputs from every capacitive sensing elements 100 and converting the outputs to numbers as grayscale values, a fingerprint image can be obtained.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A capacitive image sensor, comprising:
   a plurality of capacitive sensing elements, forming an array, each capacitive sensing element for transforming a distance between a portion of a surface of an approaching finger and a top surface thereof into an output voltage, wherein a value of the output voltage is changed by a driving signal exerted on the finger;
   an A/D converter, for converting the output voltage into a number and outputting the number; and
   a signal source, for providing the driving signal to the finger,
   wherein the driving signal is a signal with voltage transition or transitions, formed by alternate positive waveform and negative waveform; the internal electric potential at each part of the capacitive sensing elements is initialized to a known constant value during a reset stage; the capacitive sensing elements receive the driving signal and convert it to an output voltage during a sensing stage; the A/D converter performs conversion during a measuring stage; a difference between two numbers converted from the output voltages occurred in each capacitive sensing element under one positive waveform and one negative waveform, respectively, is a noise-reduced value representing a pixel for the portion surface of the finger; sequentially collect the noise-reduced values under the corresponding positive waveform and negative waveform of each pixel, and map the noise-reduced values to corresponding locations of capacitive sensing elements to obtain a noise-reduced image of the finger.

2. The capacitive image sensor according to claim 1, wherein shapes of the positive waveform and the negative waveform are symmetrical.

3. The capacitive image sensor according to claim 1, wherein the positive waveform or the negative waveform is a step function.

4. The capacitive image sensor according to claim 1, wherein the pixel image value is a numeric value that corresponds to the gray level of the pixel.

5. The capacitive image sensor according to claim 1, wherein the capacitive sensing element further comprising:
   a metal plate;
   a voltage follower, wherein an input end of the voltage follower is connected to the metal plate, and an output end of the voltage follower is connected to the A/D converter;
   a comparative capacitor, wherein one electrode of the comparative capacitor is electrically connected to the metal plate and the other electrode thereof is electrically connected to a ground end;
   a constant voltage source, for providing a constant bias voltage; and
   a constant bias voltage switch, connected to the constant voltage source and the metal plate, for switching supply of the constant bias voltage,
   wherein the constant bias voltage switch is turned on during the reset stage and is turned off during the sensing stage and the measuring stage.

6. The capacitive image sensor according to claim 5, wherein a parasitic capacitance having a value of $C_p$ is formed between the metal plate and the ground end; the comparative capacitor has a value of $C_m$; a value of a reference capacitance, $C_r$, is obtained by $C_r=C_m+C_p$; when the finger is approaching the capacitive sensing element, a signal capacitance is formed by the finger and the signal source; a finger capacitance is formed by the finger and the metal plate; the output voltage, $V_{out}$, is obtained by $$V_{out} = V_{bias} + \frac{C_f}{C_f + C_r}V_{in};$$

$V_{bias}$ is the value of the constant bias voltage; $V_{in}$ is a voltage change of the driving signal; $C_f$ is a value of the finger capacitance.

7. The capacitive image sensor according to claim 5, wherein the comparative capacitor is a MOSFET (Metal-Oxide-Semiconductor Field-Effect Transistor) capacitor, a PIP (Polysilicon-Insulator-Polysilicon) capacitor or a MIM (Metal-Insulator-Metal) capacitor.

8. The capacitive image sensor according to claim 1, wherein the capacitive sensing element further comprising:
   a metal plate;
   a voltage follower, wherein an input end of the voltage follower is connected to the metal plate, and an output end of the voltage follower is connected to the A/D converter;
   a constant voltage source, for providing a constant bias voltage; and
   a constant bias voltage switch, connected to the constant voltage source and the metal plate, for switching supply of the constant bias voltage,
   wherein the constant bias voltage switch is turned on during the reset stage and is turned off during the sensing stage and the measuring stage.

9. The capacitive image sensor according to claim 8, wherein a parasitic capacitance having a value of $C_p$ is formed between the metal plate and a ground end; a reference capacitor, $C_r$, equals to $C_p$; when the finger is approaching the capacitive sensing element, a signal capacitance is formed by the finger and the signal source; a finger capacitance is formed by the finger and the metal plate; the output voltage, $V_{out}$, is obtained by $$V_{out} = V_{bias} + \frac{C_f}{C_f + C_r} V_{in};$$

$V_{bias}$ is the value of the constant bias voltage; $V_{in}$ is a voltage change of the driving signal; $C_f$ is a value of the finger capacitance.

10. The capacitive image sensor according to claim 1, wherein the capacitive sensing element further comprising:
    a metal plate;
    a voltage follower, wherein an input end of the voltage follower is connected to the metal plate, and an output end of the voltage follower is connected to the A/D converter;
    a working voltage source, for providing a working voltage;
    a working voltage switch, connected to the working voltage source with a first end of the working voltage switch, for switching supply of the working voltage;
    a comparative capacitor, wherein one electrode of the comparative capacitor is electrically connected to a second end of the working voltage switch and the other electrode is electrically connected to a ground end;
    a charge sharing switch, electrically connected to the metal plate and the second end of the working voltage switch, to balance electric charges in both ends when turned on; and
    a ground switch, for releasing electric charges accumulated in the capacitive sensing element to the ground end when turned-on, and for accumulating electric charges in the capacitive sensing element when turned-off,
    wherein the working voltage switch is turned on during the reset stage and is turned off during the sensing stage and the measuring stage; the charge sharing switch is turned off during the reset stage and is turned on during the sensing stage and the measuring stage; the ground switch is turned on during the reset stage and is turned off during the sensing stage and the measuring stage.

11. The capacitive image sensor according to claim 10, wherein a parasitic capacitance having a value of $C_p$ is formed between the metal plate and the ground end; the comparative capacitor has a value of $C_m$; when the finger is approaching the capacitive sensing element, a signal capacitance is formed by the finger and the signal source; a finger capacitance is formed by the finger and the metal plate; the output voltage, $V_{out}$, is obtained by $$V_{out} = \frac{C_m}{C_m + C_p + C_f} V_{dd} + \frac{C_f}{C_m + C_p + C_f} V_{in};$$

$V_{dd}$ is the value of the working voltage; $V_{in}$ is a voltage change of the driving signal; $C_f$ is a value of the finger capacitance.

12. The capacitive image sensor according to claim 10, wherein the comparative capacitor is a MOSFET capacitor, a PIP capacitor or a MIM capacitor.

* * * * *